US005739525A

United States Patent [19]
Greve

[11] Patent Number: 5,739,525
[45] Date of Patent: Apr. 14, 1998

[54] DEVICE FOR DETECTING AN ELECTRONIC COMPONENT, AND COMPONENT-MOUNTING MACHINE PROVIDED WITH SUCH A DETECTION DEVICE

[75] Inventor: Peter F. Greve, Eindhoven, Netherlands

[73] Assignee: U.S. Philips Corporation, New York, N.Y.

[21] Appl. No.: 800,442

[22] Filed: Feb. 18, 1997

[30] Foreign Application Priority Data

Feb. 19, 1996 [EP] European Pat. Off. ............ 96200419

[51] Int. Cl.⁶ .................................................. H01J 5/16
[52] U.S. Cl. .................... 250/227.11; 250/239; 250/216; 356/237
[58] Field of Search ................ 250/227.11, 227.29, 250/239, 216, 222.2, 223 R, 223 B, 559.46; 356/237, 240, 241, 430

[56] References Cited

U.S. PATENT DOCUMENTS 5,072,127 12/1991 Cochran et al. .................... 250/223 B

FOREIGN PATENT DOCUMENTS

0634892A1 1/1995 European Pat. Off. .
315708A 1/1991 Japan .
4343046A 11/1992 Japan .

OTHER PUBLICATIONS

Brochure "Fast Component Mounter", Philips Electronic Technology, Jul. 1996, pp. 1–38.

Primary Examiner—Que Le
Attorney, Agent, or Firm—Anne E. Barschall

[57] ABSTRACT

A component-detection device for use in a component-mounting machine is described, which device comprises a foreground illumination system and a camera (30), this illumination system comprising at least an optical guide (40) arranged between the component (10) and the camera, and an associated set of radiation sources (45, 46, 47, 48) irradiating the optical guide. This provides a uniform foreground illumination for the component and a reliable detection of this component.

19 Claims, 8 Drawing Sheets

DEVICE FOR DETECTING AN ELECTRONIC COMPONENT, AND COMPONENT-MOUNTING MACHINE PROVIDED WITH SUCH A DETECTION DEVICE

The invention relates to a device for detecting an electronic component held in a mounting head, which device comprises a foreground illumination system for illuminating the component and its ambience, and photoelectric means for converting radiation reflected by the component into electric signals, the illumination system being arranged between the component and the photoelectric means and having radiation-generating means.

The invention also relates to a component-mounting machine provided with such a detection device.

Such a machine is used for automatically and accurately mounting electronic components on a support. The supports and the individual components are separately fed to the machine. The machine is provided with a transport system for transporting one support at a time to a mounting station where the components are secured to the support. The machine further comprises at least one mounting head provided with a suction pipette. Each time, one of the components fed to the machine is picked up with each mounting head and transported to the mounting station via a detection station. In the detection station, or detection device, for example the positions of the connection terminals of the component are detected. The position data are applied to a signal processing unit which forms part of a mounting unit in which the mounting head is incorporated, where they are compared with reference data. During transport of the component from the detection device to the mounting station, corrections can thus be performed on the positions, for example by corrective displacements in the X and Y direction of an XYZ system of coordinates and/or by rotations about the suction pipette axis extending in the Z direction. The detection device also provides the possibility of identifying a component and checking its quality. All these types of measurements are considered to be termed as detections. The detection device comprises a foreground illumination system which directly irradiates the component. The radiation reflected by the component is received by radiation-sensitive means, such as a camera, with which the data comprised in the radiation are converted into electric signals.

For a satisfactory detection of the component it is necessary that the radiation supplied by the illumination system covers a large spatial angle and is homogeneous. In the English-language abstract of the published Japanese Patent Application No. 3-015708 a foreground illumination system is shown which consists of a double-walled hemisphere whose inner wall is a diffusor and whose outer wall is a reflector. A number of radiation sources has been arranged between the inner wall and the outer wall. The wall of the hemisphere has a central aperture behind which a camera is arranged. This illumination system requires much mounting space and is less suitable for a mounting machine comprising a plurality of mounting units.

It is an object of the invention to provide the detection device with an illumination system which is compact and supplies a satisfactory uniform illumination through a large spatial angle. To this end, the detection device is characterized in that a plurality of radiation sources and an optical guide are arranged between the component and the photoelectric means, in that the optical guide has an open upper side facing the component, an apertured lower wall facing the photoelectric means, and four side walls, and in that the walls of the optical guide consist of a radiation-transmissive material and are provided with a diffusely reflective material on the outer side, with the exception of portions situated opposite the radiation sources.

The radiation from the sources enters the plate-shaped walls via said wall portions, propagates therein until it impinges upon the reflective layer, is then diffusely reflected and can subsequently reach another wall to be diffusely reflected again, and so forth. Via a large number of diffuse reflections within the optical guide, the radiation acquires a satisfactory uniform intensity distribution and can reach the component via the open upper wall and through a large number of spatial angles. A great advantage of this detection device is that none of the radiation sources directly irradiates the components.

A preferred embodiment of the device is further characterized in that the material of the walls is a radiation-transmissive synthetic material.

Such a material is light in weight and inexpensive, so that it is very suitable for this use.

This embodiment may be further characterized in that the reflective layer is a coat of paint.

By coating the outer sides of the optical guide with the paint, the desired diffusely reflective layer is obtained in an inexpensive and simple manner.

The lower wall of the optical guide should have a central aperture so as to transmit the radiation reflected by the component to the camera. At the location of this aperture, radiation from the radiation sources is not reflected, so that a black spot can be produced in the illumination pattern at the location of the component. For a satisfactory illumination, this should therefore be a small aperture. However, in practice this is often impossible, particularly if a telecentric image is to be made. Moreover, there should be a facility in the mounting unit to remove an electronic component detached from the pipette so as to prevent the camera from being shielded. This requires a relatively large aperture in the lower wall of the luminaire.

To comply with the contradictory requirements described hereinbefore, the detection device is preferably further characterized in that a second optical guide and a second set of radiation sources are arranged between said first optical guide and the photoelectric means, said second optical guide having two radiation-transmissive apertures which are located opposite each other and are in register with the two apertures in the first optical guide.

Since the second optical guide irradiates the aperture in the lower wall of the first optical guide, the radiation transmitted through this aperture and coming from the radiation sources associated with the first optical guide is compensated to a large extent, so that said black spot in the illumination pattern at the location of the component to be detected is reduced considerably. It is to be noted that the English-language abstract of the published Japanese Patent Application No. 4-343046 shows a device for detecting an electronic component in which a number of radiation sources are arranged between the component and the camera. However, these sources are annular and have different diameters so that each of them irradiates the component at a different spatial angle. The annular radiation sources combined could be considered as an alternative to the first optical guide of the device according to the invention, if it were not for the fact that switching takes place from one annular radiation source to the other so as to observe the component under different illumination conditions and select the optimum condition. The annular radiation sources are not intended to give a homogeneous illumination intensity in all directions. The second optical guide also has a radiation-transmissive aperture at its lower side. Its effect on the illumination pattern is considerably smaller than that of the aperture in the lower wall of the first optical guide. It is, however, preferred to reduce the effect of the second aperture. This is realized in an embodiment of the detection device which is further characterized in that a third optical guide and a third set of radiation sources are arranged between the second optical guide and the photoelectric means, said third optical guide having two radiation-transmissive apertures which are located opposite each other and are in register with the apertures in the first and the second optical guide.

With respect to the second optical guide, the third optical guide has a similar effect as the second optical guide with respect to the first optical guide.

This embodiment may be further characterized in that the second optical guide and the third optical guide, if any, are constituted by hollow elements whose inner walls are coated with a diffusely reflective layer, with the exception of the radiation-transmissive apertures.

This layer may also be a coat of paint, and the second and third optical guides may also be manufactured in a simple and inexpensive way.

In accordance with a further aspect of the invention, the detection device may be further characterized in that the radiation sources associated with each optical guide are punctiform radiation sources.

This detection device is preferably further characterized in that the radiation sources are light-emitting diodes.

Such diodes, or LEDs, are relatively inexpensive and require little mounting space.

The reliability and possibilities of the detection device may be enhanced if it is further characterized in that the device is further provided with a background illumination system.

The background illumination ensures that the component to be detected is illuminated from behind and that shadow images of this component are formed on the radiation-sensitive means. With such an illumination, for example the dimensions and orientation of the component can be satisfactorily detected.

To prevent radiation from the foreground illumination and radiation falling alongside the component from influencing the background illumination, the device using the two types of illumination is further characterized in that the background illumination system is constituted by a fourth radiation source arranged under a pipette which is present in the mounting head for holding a component, and a plate secured to the pipette, said plate being provided with a color-selective reflective layer which reflects the incident radiation coming from the fourth radiation source at a given wavelength and does not reflect radiation coming from the first optical guide.

Since the foreground illumination has a different color than the background illumination, the illuminations can no longer influence each other. If the photoelectric means are constituted by a color camera, the foreground and background illuminations can then be used simultaneously.

However, this detection device may also be further characterized in that switching means are present for selectively switching on the foreground and/or the background illumination.

The detection device using the background illumination is preferably further characterized in that the fourth radiation source is constituted by at least one annular radiation element.

Consequently, a background illumination having a high intensity can be realized, which, moreover, requires little mounting space.

To prevent that a shadow caused by the pipette is produced in the background illumination, the device is further characterized in that the pipette is provided with reflective means.

Background radiation incident on the pipette is thus reflected towards the plate secured to the pipette and used for the background illumination.

The invention also relates to a mounting machine comprising a frame, a robot, a transport system for transporting supports, a mounting head for mounting components, which mounting head is secured to an arm of the robot, and a component-detection device. This machine is characterized in that the detection device is implemented as described hereinbefore.

These and other aspects of the invention will be apparent from and elucidated with reference to the embodiments described hereinafter.

DETAILED DESCRIPTION OF THE DRAWINGS

Figure 1:
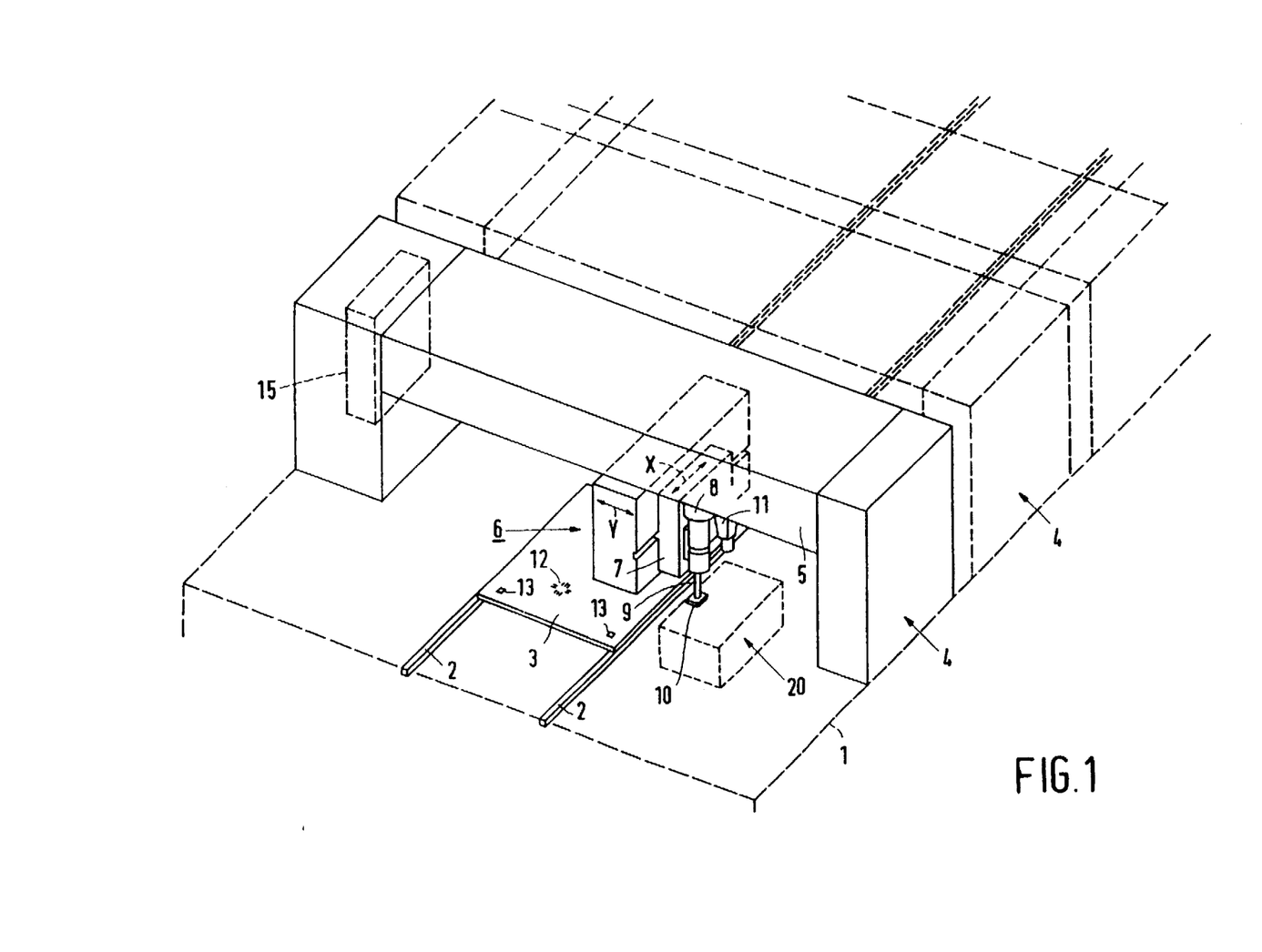
FIG. 1 shows diagrammatically an embodiment of a mounting machine in which the invention is used.

The invention may be used, inter alia, in a component-mounting machine which has been manufactured by the firm of Philips for several years and is known as FCM (Fast Component Mounter) and described in, inter alia, the brochure "FAST COMPONENT MOUNTER" of Philips Electronic Manufacturing Technology of July 1995. FIG. 1 shows diagrammatically a part of said type of mounting machine.

The reference numeral 1 denotes the machine frame by way of a broken line. Arranged on the frame 1 is a transport system, only the transport rails 2 of which are shown, for transporting supports or printed circuit boards 3. A component-mounting unit 4 constituted by a U-shaped frame 5, to which an X-Y robot 6 is secured, is arranged above the transport rails. The X-Y movement of the robot 6 is denoted by arrows. The robot movement may, however, also be an .r movement. A mounting head 8, with which components can be placed on the support, is secured to an arm 7 of the robot. The mounting head has a suction pipette 9 with which components can be picked up from a feeder and placed on the support 3. An image sensor 11 for the support is also secured to the arm 7. For accurately positioning a component on the support, it is necessary that the exact position of the spot 12 where the component must be placed on the support is known. This position can be determined by taking a picture of given fiducials 13 on the support by means of the image sensor, for example a camera. The relative position, with respect to such fiducials, of the position where the component must be mounted on the support is known in advance. The data supplied by the image sensor 11 about the position of the fiducials are applied in the form of an electric signal to a signal processing unit 15 in which they are compared with reference data stored in the unit 15, so that deviations can be computed.

Figure 2:
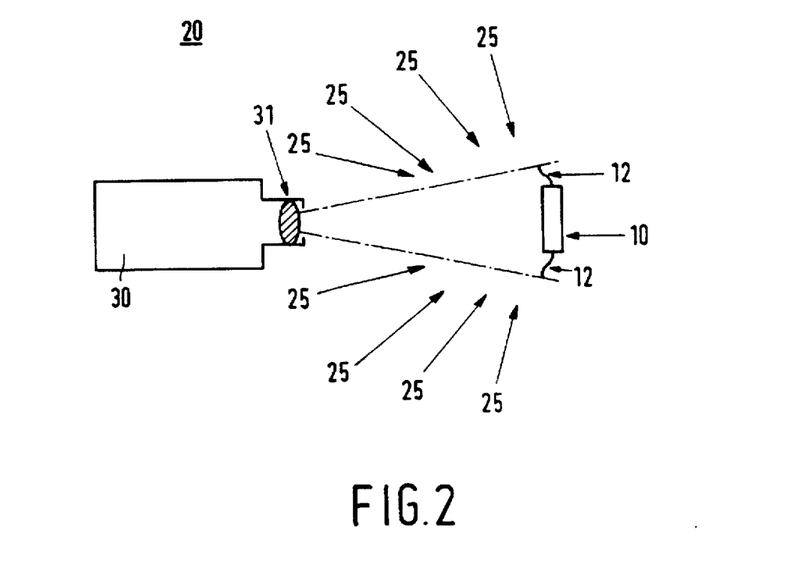
FIG. 2 shows the principle of the foreground illumination.

The mounting unit 4 is further provided with a component detection device, denoted by the block 20 in FIG. 1. This detection unit may be used to determine the relative position of the component 10, notably that of its pins with respect to the suction pipette 9. To this end, the suction pipette 9 with the component 10 is positioned above the detection device 20. As is shown in FIG. 2 etc., the detection device comprises an illumination system for illuminating the component, and an image sensor, for example a CCD camera for observing the component and generating an electric signal in which the position data are comprised. This signal is applied to the signal processing unit 15 and compared with data stored in this unit. With the result of this comparison and the data about the position where the component pins must be placed, the robot 6 with the mounting head can be controlled in such a way that the component acquires the correct position on the support, whereafter it can be secured to the support.

The mounting machine may be provided with a plurality of mounting units 4 for mounting different components, as is shown by means of the broken lines in FIG. 1. Each mounting unit is provided with an X-Y robot, a mounting head, an image sensor and a signal processing unit.

Figure 3:
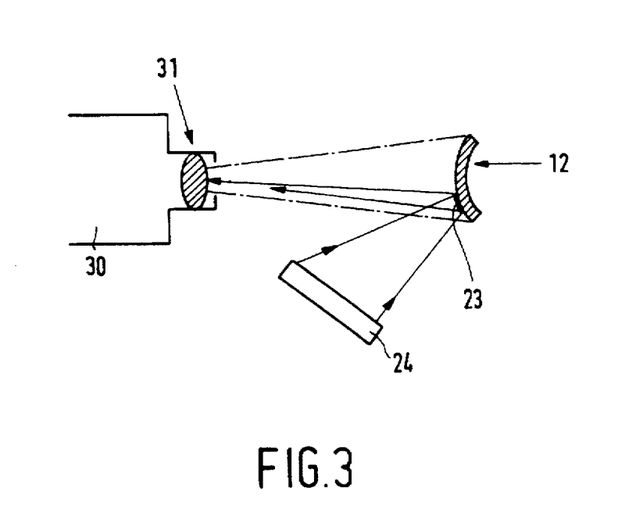
FIG. 3 shows a foreground illumination at a small spatial angle.

FIG. 2 shows the principle of the component- detection device 20. This device comprises photoelectric means, or an image sensor, for example in the form of a camera 30 with an objective lens 31 and a foreground illumination system shown diagrammatically by means of radiation arrows 25. If, as shown in FIG. 3, a narrow beam of light from a radiation source 24 were used for the illumination, only light from only a part 23 of a pin 12 would reach the camera. Then there is no good detection of the component and the pins because only a part of the pin or the component can be observed.

Figure 4:
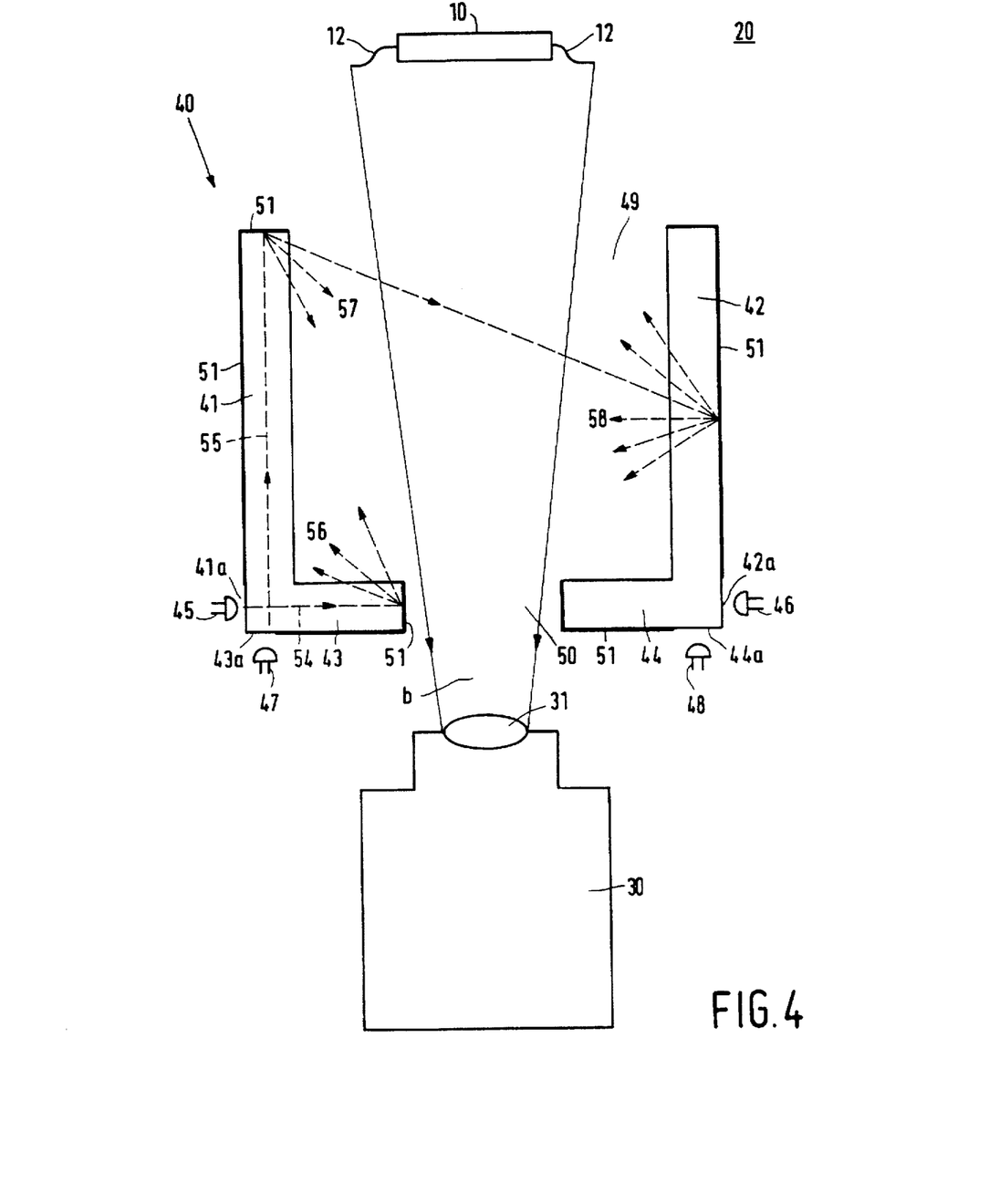
FIG. 4 shows a detection device with a foreground illumination system provided with a first optical guide.

To satisfactorily recognize the pins of the component with foreground illumination, it is necessary that light having a uniform intensity distribution is presented at a large spatial angle, as is shown in FIG. 2. This can be realized by making use of an optical guide, or luminaire, 40 which is shown in FIG. 4. The optical guide has four side walls, two of which, 41 and 42, are shown in FIG. 4, a lower wall 43, 44 and an open upper side 49 or an upper wall with a light-transmissive aperture. The optical guide is irradiated by external radiation sources 45 and 46 arranged at both sides of the optical guide and/or radiation sources 47 and 48 arranged below the optical guide.

The walls 41, 42, 43, 44 are constituted by plates of light-transmissive material coated at their outer side with a diffusely reflective layer 51, with the exception of the portions 41a, 42a, 43a, 44a. Light rays from the sources 45, 46, 47 and 48 enter the walls of the optical guide through the portions 41a, 42a, 43a and 44a. For the sake of clarity, only two such rays 54 and 55 are shown. The ray 54 traverses the wall 43 and is incident on the reflective layer 51 where it is diffusely reflected, which is illustrated by the rays 56, partly into this wall and partly in the direction of the wall 41 so as to be further diffusely reflected at this wall. Analogously, the ray 55 traverses the wall 41 until it has reached the reflective layer 51. There, it is diffusely reflected, which is illustrated by means of the rays 57. A part of this diffusely reflected light reaches the wall 42, where further diffusely reflected light is produced, which is illustrated by the rays 58. It will be evident that the light from the sources 45, 46, 47 and 48 entering the walls 41, 42, 43 and 44 is reflected in the optical guide 40 a large number of times or not such a large number of times, dependent on the direction of the entering light, so as to finally exit through the open upper side and to illuminate the component 10. Due to the large number of diffuse reflections, the exiting light has a uniform intensity distribution and covers a large spatial angle. The component is thus uniformly illuminated from all sides. Viewed from the component, none of the radiation sources is visible, in other words, none of the radiation sources emits light directly to the component.

The radiation sources 45, 46, 47 and 48 are preferably light-emitting diodes, or LEDs, which have the advantage that they are small and inexpensive and yet supply sufficient light. These LEDs emit, for example, red light. Radiation other than visible red light may of course also be used for the detection. In that case, the term radiation instead of light should be used hereinafter and in the foregoing. The number of radiation sources may also be larger or smaller than four. The diffusely reflective layer 51 is preferably a coat of paint which can be provided in a simple and inexpensive manner. The walls 41, 42, 43 and 44 may be made of glass or another transparent material, but preferably consist of a transparent synthetic material such as polymethyl methacrylate (PMMA) which has a good optical quality and is light in weight and inexpensive.

The illumination system shown in FIG. 4 is inexpensive, light-weight and compact so that it is eminently suitable for use, notably in a mounting machine comprising a plurality of mounting units, but also in other mounting machines.

Figure 5:
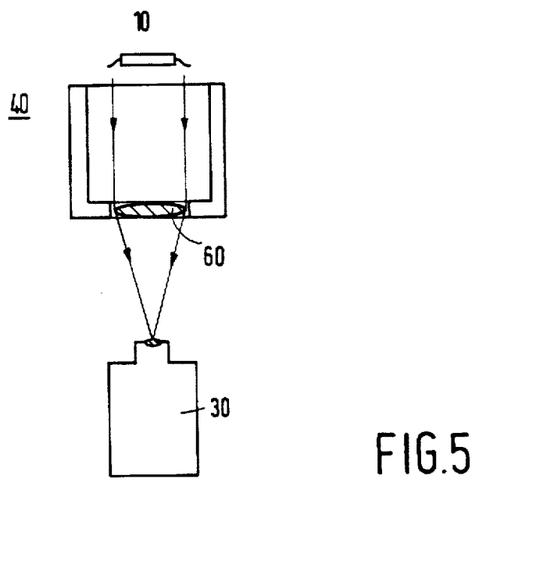
FIG. 5 shows a detection device in which a telecentric image is formed.
Figure 6:
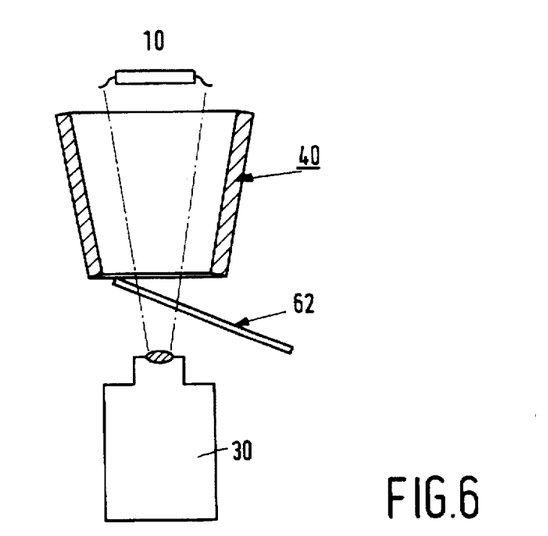
FIG. 6 shows a detection device having a facility for removing components.

The optical guide 40 should have an aperture 50 at its lower side in order that the light reflected by the component can reach the camera 30. At the location of this aperture, no light from the sources 45, 46, 47 and 48 is reflected, but a part of this light exits from the optical guide. This part does not contribute to the illumination of the component and causes a dark spot in the center of the illumination pattern and hence a degradation of the detection. To minimize this effect, the aperture 48 should be as small as possible. However, in practice it is often desirable to make a telecentric image of the component, as is shown in FIG. 5, so that it is not necessary to impose strict requirements on the distance between the component and the camera. A lens 60 which is larger than the component to be inspected should then be arranged in or proximate to the aperture 50 so that this aperture should be relatively large. A large aperture 50 may also be desirable for another reason, namely for removing components detached from the pipette or rejected components via a removal plate 62 which may consist of a thin glass plate as is shown in FIG. 6.

Figure 7:
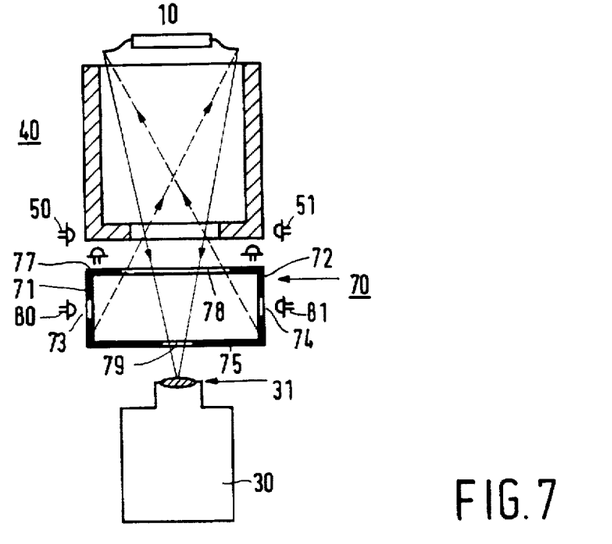
FIG. 7 shows a detection device with an illumination system provided with two optical guides.

To prevent a large dark spot from being produced in the illumination, also with a large aperture 50, a further aspect of the invention provides a second optical guide 70 which is arranged between the first optical guide and the camera, as is shown in FIG. 7. This optical guide is also irradiated by external radiation sources 80 and 81, for example LEDs which are placed at both sides of the optical guide 70 and/or under the optical guide and whose light enters the guide via the apertures 73 and 74 in the walls 71 and 72. Via reflections on the side walls 71 and 72 and the lower wall 75, this light reaches a transparent portion 78 of the upper wall 77 and is passed to the first optical guide 40. The light enters this optical guide via the aperture 50 where it is combined with the light from the sources 45, 46, 47 and 48 associated with this optical guide. Thus, the loss of light, caused by the aperture 50, from the first radiation sources 45, 46, 47 and 48 is compensated by light from the second radiation sources 80, 81, etc. entering this aperture. The second optical guide and its associated radiation sources may be controlled in such a way that this compensation is exactly correct and that no or substantially no spot is visible in the illumination.

The lower wall 75 of the second optical guide should also be provided with a light-transmissive part, or aperture 79 for passing the beam b from the component to the camera. For a satisfactory operation, the apertures 48, 78 and 79 should be in register with each other and with the camera, i.e. the centers of these apertures should be located on the optical axis of the camera.

Figure 8:
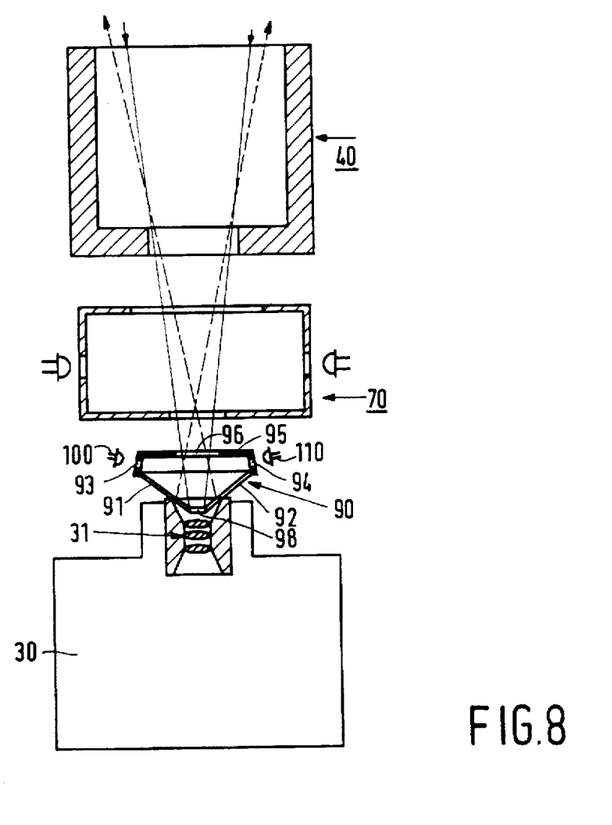
FIG. 8 shows a detection device with an illumination system provided with three optical guides.

A part of the light coming from the second radiation sources 80, 81 exits through the aperture 79, so that a dark spot is produced in the illumination pattern of the second optical guide only, which has its influence on the total illumination pattern of the first and the second optical guide combined. The effect of the aperture 79 on the total illumination pattern is, however, much smaller than the effect of the aperture 50, if only the first optical guide is used. The minor effect of the aperture 79 may even be further reduced by arranging a third optical guide between the second optical guide and the camera, as is shown in FIG. 8. The third optical guide has also reflective side walls 91, 92 and an upper wall 95 which is provided with a light-transmissive window or aperture 96. The side walls are now oblique so that the bottom consists of a light-transmissive aperture 98 only. This aperture may be arranged proximate to or against the lens 31, hence at a position in the beam b where it has a minimum diameter. Two or more radiation sources 100, 101 are arranged around the third optical guide, which radiation sources irradiate the guide via associated light-transmissive portions or apertures 93, 94. The operation of the third optical guide is analogous to that of the second optical guide and does not need any further explanation. With the third optical guide, the loss of radiation from the second radiation sources, which loss is caused by the aperture 79, can be compensated with light from the third radiation sources 100, 101.

FIG. 8 shows that the camera lens comprises a plurality of lens elements. This of course also applies to the embodiment of FIG. 7. The second and possibly third embodiments are, for example hollow elements which are provided with a diffusely reflective layer on the inner side. This layer may again be, for example a white coat of paint. If the component to be detected is to be illuminated with a different color, a different color of paint may be provided. The provision of a coat of paint is a simple and inexpensive manner of rendering a surface diffusely reflective.

Instead of LEDs, other sources may alternatively be used as second and third radiation sources, such as elongated gas discharge lamps. The radiation used does not need to be visible light but may also be radiation having a wavelength outside the visible range. This radiation could be used if small and cheap radiation sources and cameras were available. In the embodiments described, the optical guides and the camera are in alignment. If desired, for example for reasons of available mounting space, the height of the radiation path may be reduced by folding it, for example by providing a folding mirror between the camera and the third optical guide, or between the second and third optical guides in FIG. 8, or between the camera and the second optical guide in FIG. 7.

Figure 9A:
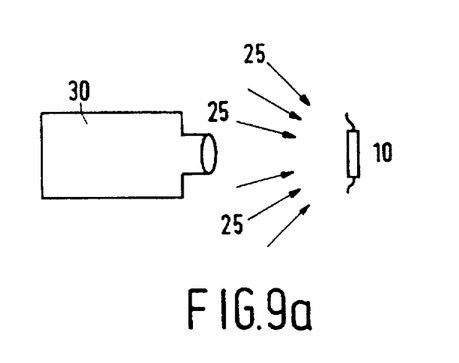
FIG. 9a and FIG. 9b show the principle of the foreground illumination and the background illumination, respectively.
Figure 9B:
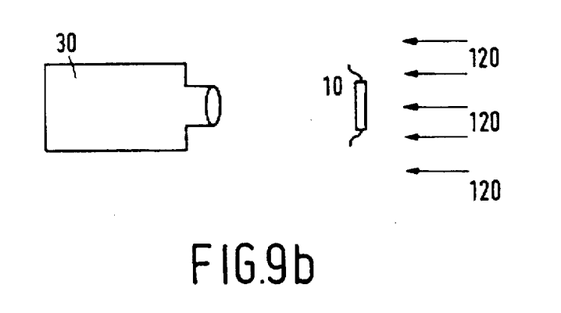

In addition to a uniform and bright foreground illumination, with which a bright image against a dark background is obtained, a background illumination is often desirable in the detection device. FIG. 9a shows the principle of the foreground illumination and FIG. 9b shows the principle of the background illumination. In the background illumination, the component 10 is irradiated from behind, with rays 120, and a shadow image of the object against a bright background is obtained. This illumination is particularly suitable for detecting contours, dimensions and orientation of a component.

Figure 10:
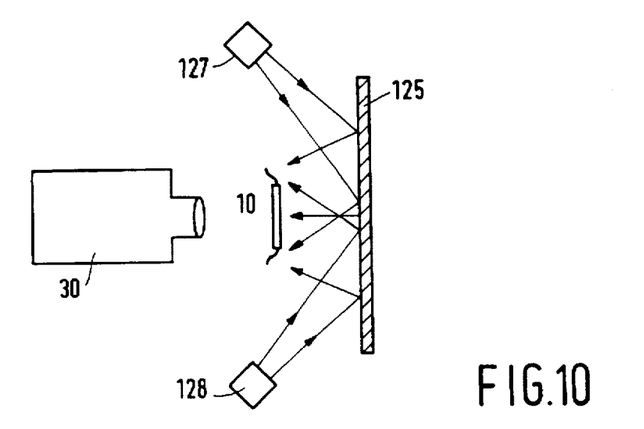
FIG. 10 shows an embodiment of a background illumination system.

A problem arises if the background illumination is realized with a reflector 125 arranged behind the component and being irradiated by one or more radiation sources 127, 128 arranged between the reflector and the camera, as is shown in FIG. 10. The reflector, or another background, will have to be white, or in any case not too dark if it is to have a satisfactory background illumination effect. However, the light of the foreground illumination falling beside the component will then also be reflected by the element 125, so that notably a foreground illumination image will be less reliable. This problem can be solved by choosing a different color for the foreground illumination than for the background illumination. To this end, the reflector 125 may be implemented in such a way that it mainly reflects a given color, for example blue, while the foreground illumination sources emit a different color of light, for example red light.

Figure 11:
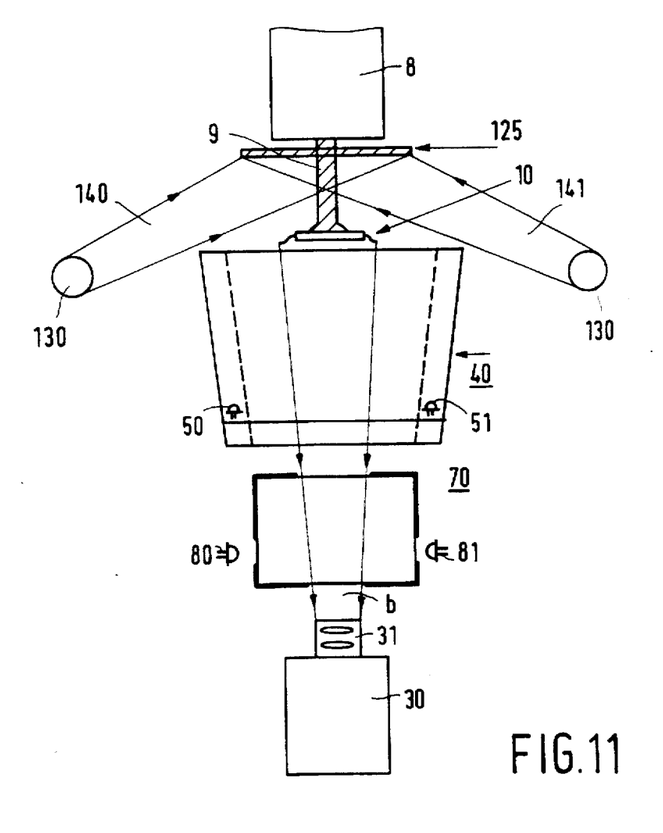
FIG. 11 shows an embodiment of a detection device with a foreground and a background illumination system.

FIG. 11 shows an embodiment of such a combined foreground and background illumination system, in which the foreground illumination system is implemented as described hereinbefore. The radiation sources 130 of the background illumination system are constituted by a plurality of gas discharge tubes which are grouped, for example in two squares, or by two thin gas discharge tubes bent to a square and arranged around the first optical guide of the foreground illumination system. The light emitted by these tubes is incident on a plate-shaped element 125 which is secured to the pipette 9. The element is painted in a given color so that it reflects the light of this color towards the component to be detected. An optimal embodiment is the one in which the foreground radiation sources are LEDs which emit red light at a wavelength of 680 nm, while the element 125 is painted blue. Of the white light incident on this element, approximately 25% is diffusely reflected, while approximately 4% of the red light is reflected. When using blue light for the background illumination, the difference in reflection will even be greater. The relatively low reflection coefficient for white light does not pose any problem because the white radiation sources have a considerably higher intensity than the LEDs.

The use of two different colors of light for the foreground and background illuminations provides the extra advantage that the foreground and background illuminations can be used simultaneously if the camera is a color camera. Then, a measurement can provide the information for which otherwise two measurements, a foreground measurement and a background measurement, would be necessary. The device further comprises switching means (not shown) with which either the radiation sources of the foreground illumination or those of the background illumination, or both sources simultaneously can be arbitrarily switched on and off.

Figure 12:
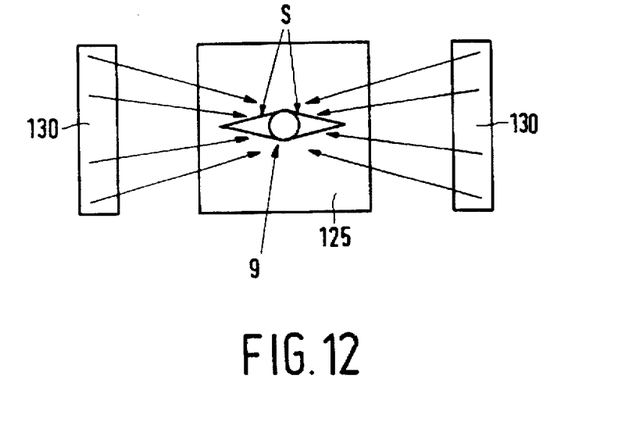
FIG. 12 shows the shadow formed in the background illumination in the case of an insufficiently large angle of irradiation.
Figure 13:
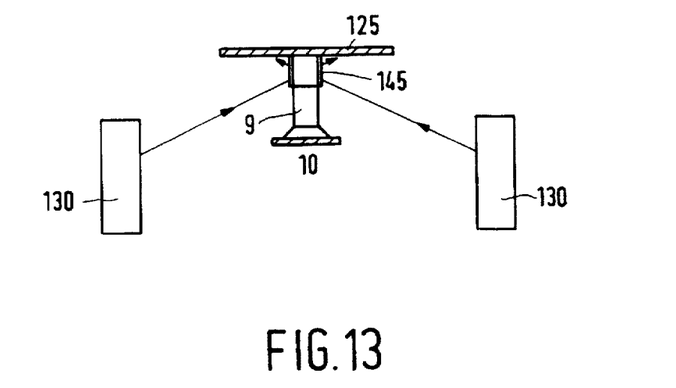
FIG. 13 shows a pipette provided with reflective means to prevent this shadow.

A part of the white light beams 140, 141 is incident on the pipette 9. If the white light is not presented all round, a shadow S as shown in FIG. 12 will be produced on the plate 125 so that the background illumination is no longer uniform. To prevent this, at least a part of the pipette, i.e. the part adjoining the plate 125, may be made reflective, as is shown in FIG. 13. to this end, this part may be given a square shape, or a reflective clamping piece may be secured to the pipette. The shadow is then partly filled up with the reflected light.

I claim:

1. A device for detecting an electronic component held in a mounting head, which device comprises a foreground illumination system for illuminating the component and its ambience, and photoelectric means for converting radiation reflected by the component into electric signals, the illumination system being arranged between the component and the photoelectric means and having radiation-generating means, characterized in that a plurality of radiation sources and an optical guide are arranged between the component and the photoelectric means, in that the optical guide has an open upper side facing the component, an apertured lower wall facing the photoelectric means, and four side walls, and in that the walls of the optical guide consist of a radiation-transmissive material and are provided with a diffusely reflective material on the outer side, with the exception of portions situated opposite the radiation sources.

2. A device as claimed in claim 1, characterized in that the material of the walls is a radiation-transmissive synthetic material.

3. A device as claimed in claim 1, characterized in that the reflective layer is a coat of paint.

4. A device as claimed in claim 1, characterized in that a second optical guide and a second set of radiation sources are arranged between said first optical guide and the photoelectric means, said second optical guide having two radiation-transmissive apertures which are located opposite each other and are in register with the two apertures in the first optical guide.

5. A device as claimed in claim 4, characterized in that a third optical guide and a third set of radiation sources are arranged between the second optical guide and the photoelectric means, said third optical guide having two radiation-transmissive apertures which are located opposite each other and are in register with the apertures in the first and the second optical guide.

6. A device as claimed in claim 5, characterized in that the second optical guide and the third optical guide, if any, are constituted by hollow elements whose inner walls are coated with a diffusely reflective layer, with the exception of the radiation-transmissive apertures.

7. A device as claimed in claim 1, characterized in that the radiation sources associated with each optical guide are punctiform radiation sources.

8. A device as claimed in claim 7, characterized in that the radiation sources are light-emitting diodes.

9. A device as claimed in claim 1, characterized in that the device is further provided with a background illumination system.

10. A device as claimed in claim 9, characterized in that the background illumination system is constituted by a fourth radiation source arranged under a pipette which is present in the mounting head for holding a component, and a plate secured to the pipette, said plate being provided with a color-selective reflective layer which reflects the incident radiation coming from the fourth radiation source at a given wavelength and does not reflect radiation coming from the first optical guide.

11. A device as claimed in claim 10, characterized in that switching means are present for selectively switching on the foreground and/or background illumination.

12. A device as claimed in claim 10, characterized in that the fourth radiation source is constituted by at least one annular radiation element.

13. A device as claimed in claim 10, characterized in that the pipette is provided with reflective means.

14. A component-mounting machine comprising a frame, a robot, a transport system for transporting supports, a mounting head for mounting components, which mounting head is secured to an arm of the robot, and a component-detection device, characterized in that the detection device is a device as claimed in claim 1.

15. A device as claimed in claim 4, characterized in that the second optical guide is constituted by a hollow element whose inner walls are coated with a diffusely reflective layer, with the exception of the radiation transmissive apertures.

16. A device as claimed in claim 4, characterized in that the radiation sources associated with each optical guide are punctiform radiation sources.

17. A device as claimed in claim 5, characterized in that the radiation sources associated with each optical guide are punctiform radiation sources.

18. A component-mounting machine comprising a frame, a robot, a transport system for transporting supports, a mounting head for mounting components, which mounting head is secured to an arm of the robot, and a component-detection device, characterized in that the detection device is a device as claimed in claim 4.

19. A component-mounting machine comprising a frame, a robot, a transport system for transporting supports, a mounting head for mounting components, which mounting head is secured to an arm of the robot, and a component-detection device, characterized in that the detection device is a device as claimed in claim 5.

* * * * *